United States Patent
Zhou et al.

(10) Patent No.: US 10,615,150 B2
(45) Date of Patent: Apr. 7, 2020

(54) SEMICONDUCTOR DEVICE WITH A LAYERED PROTECTION MECHANISM AND ASSOCIATED SYSTEMS, DEVICES, AND METHODS

(71) Applicant: Micron Technology, Inc., Boise, ID (US)

(72) Inventors: Wei Zhou, Boise, ID (US); Bret K. Street, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/405,935

(22) Filed: May 7, 2019

(65) Prior Publication Data
US 2019/0267352 A1   Aug. 29, 2019

Related U.S. Application Data

(63) Continuation of application No. 15/878,755, filed on Jan. 24, 2018, now Pat. No. 10,381,329.

(51) Int. Cl.
*H01L 23/00* (2006.01)
*H01L 25/065* (2006.01)
(Continued)

(52) U.S. Cl.
CPC ........ *H01L 25/0657* (2013.01); *H01L 21/563* (2013.01); *H01L 23/36* (2013.01);
(Continued)

(58) Field of Classification Search
CPC ......... H01L 23/00; H01L 23/48; H01L 23/31; H01L 23/481; H01L 23/367;
(Continued)

(56) References Cited

U.S. PATENT DOCUMENTS 8,299,633 B2   10/2012   Su
9,093,364 B2   7/2015   Pagaila
(Continued)

FOREIGN PATENT DOCUMENTS

CN   102668075 A   9/2012
KR   20110125796 A   11/2011
TW   201727772 A   8/2017

OTHER PUBLICATIONS

International Application No. PCT/US2018/041746—International Search Report and Written Opinion, dated Nov. 2, 2018, 12 pages.
(Continued)

*Primary Examiner* — Chuong A Luu
(74) *Attorney, Agent, or Firm* — Perkins Coie LLP

(57) ABSTRACT

A semiconductor device includes a first die; a second die attached over the first die; a first metal enclosure and a second metal enclosure both directly contacting and vertically extending between the first die and the second die, wherein the first metal enclosure peripherally encircles a set of one or more internal interconnects and the second metal enclosure peripherally encircles the first metal enclosure without directly contacting the first metal enclosure; a first enclosure connector electrically connecting the first metal enclosure to a first voltage level; a second enclosure connector electrically connecting the second metal enclosure to a second voltage level; and wherein the first metal enclosure, the second metal enclosure, the first enclosure connector, and the second enclosure connector are configured to provide an enclosure capacitance.

17 Claims, 7 Drawing Sheets

(51) Int. Cl.
  *H01L 23/495* (2006.01)
  *H01L 23/48* (2006.01)
  *H01L 25/00* (2006.01)
  *H01L 23/64* (2006.01)
  *H01L 21/56* (2006.01)
  *H01L 23/36* (2006.01)

(52) U.S. Cl.
  CPC ...... *H01L 23/481* (2013.01); *H01L 23/49541* (2013.01); *H01L 23/642* (2013.01); *H01L 25/50* (2013.01); *H01L 2225/06513* (2013.01)

(58) Field of Classification Search
  CPC ............ H01L 23/49541; H01L 23/495; H01L 23/498; H01L 23/3107; H01L 23/49827; H01L 23/552; H01L 23/42; H01L 23/3192; H01L 23/295; H01L 23/3121; H01L 23/4334; H01L 23/055; H01L 23/3737; H01L 23/433; H01L 23/3185; H01L 23/4012; H01L 23/4951; H01L 23/3114; H01L 25/043; H01L 25/0657; H01L 25/0756; H01L 25/117; H01L 25/074; H01L 2225/06503; H01L 2225/06513; H01L 2224/24135
  USPC ........................................................ 257/676
  See application file for complete search history.

(56) References Cited

U.S. PATENT DOCUMENTS

| | | | |
|---|---|---|---|
| 9,356,009 B2 | 5/2016 | Chandolu | |
| 10,381,329 B1 | 8/2019 | Zhou et al. | |
| 2003/0104652 A1* | 6/2003 | LeBonheur | H01L 21/563 438/108 |
| 2003/0214029 A1 | 11/2003 | Tao et al. | |
| 2004/0014308 A1 | 1/2004 | Kellar et al. | |
| 2004/0043515 A1* | 3/2004 | Goller | H01L 21/56 438/1 |
| 2004/0159960 A1 | 8/2004 | Fujiwara et al. | |
| 2004/0231872 A1 | 11/2004 | Arnold et al. | |
| 2005/0135041 A1 | 6/2005 | Kang et al. | |
| 2006/0103015 A1 | 5/2006 | Farrar et al. | |
| 2007/0057357 A1 | 3/2007 | Chen | |
| 2007/0267725 A1 | 11/2007 | Lee et al. | |
| 2008/0054433 A1 | 3/2008 | Yoo et al. | |
| 2009/0014856 A1 | 1/2009 | Knickerbocker | |
| 2009/0121334 A1 | 5/2009 | Oi et al. | |
| 2009/0194861 A1 | 8/2009 | Bonse et al. | |
| 2009/0224371 A1 | 9/2009 | Yu et al. | |
| 2010/0105171 A1 | 4/2010 | Lee et al. | |
| 2010/0244208 A1 | 9/2010 | Pagaila et al. | |
| 2010/0258950 A1 | 10/2010 | Li et al. | |
| 2011/0147899 A1 | 6/2011 | Dahilig et al. | |
| 2013/0075879 A1 | 3/2013 | Yang | |
| 2013/0075923 A1 | 3/2013 | Park et al. | |
| 2013/0234317 A1 | 9/2013 | Chen et al. | |
| 2014/0197526 A1 | 7/2014 | Yoo et al. | |
| 2015/0014844 A1 | 1/2015 | Wu et al. | |
| 2015/0091178 A1 | 4/2015 | Reber et al. | |
| 2015/0187745 A1 | 7/2015 | Chiu et al. | |
| 2015/0333026 A1 | 11/2015 | Gandhi et al. | |
| 2015/0348954 A1 | 12/2015 | Chandolu | |
| 2017/0040309 A1 | 2/2017 | Kent | |
| 2017/0125375 A1 | 5/2017 | Chinnusamy et al. | |
| 2018/0151513 A1 | 5/2018 | Stone | |
| 2019/0067137 A1 | 2/2019 | Zhou et al. | |
| 2019/0229089 A1 | 7/2019 | Zhou et al. | |
| 2019/0229090 A1 | 7/2019 | Zhou et al. | |

OTHER PUBLICATIONS

International Application No. PCT/US2018/063662—International Search Report and Written Opinion, dated Apr. 5, 2019, 14 pages.
TW Patent Application No. 107125987—Taiwanese Office Action and Search Report, dated Apr. 10, 2019, with English Translation, 11 pages.
U.S. Appl. No. 15/878,725—Unpublished patent application by Wei Zhou et al., titled "Semiconductor Device With an Electrically-Coupled Protection Mechanism and Associated Systems, Devices, and Methods", filed Jan. 24, 2018, 34 pages.
TW Patent Application No. 107145862—Taiwanese Office Action and Search Report, dated Sep. 20, 2019, with English Translation, 12 pages.

* cited by examiner

SEMICONDUCTOR DEVICE WITH A LAYERED PROTECTION MECHANISM AND ASSOCIATED SYSTEMS, DEVICES, AND METHODS

CROSS-REFERENCE TO RELATED APPLICATIONS

This application is a continuation of U.S. application Ser. No. 15/878,755, filed Jan. 24, 2018, which is incorporated herein by reference in its entirety.

This application contains subject matter related to a previously-filed U.S. patent application by Wei Zhou, Bret Street, and Mark Tuttle titled "SEMICONDUCTOR DEVICE WITH A PROTECTION MECHANISM AND ASSOCIATED SYSTEMS, DEVICES, AND METHODS." The related application is assigned to Micron Technology, Inc., and is identified by application Ser. No. 15/693,230, filed Aug. 31, 2017. The subject matter thereof is incorporated herein by reference thereto.

This application contains subject matter related to an U.S. patent application by Wei Zhou and Bret Street titled "SEMICONDUCTOR DEVICE WITH AN ELECTRICALLY-COUPLED PROTECTION MECHANISM AND ASSOCIATED SYSTEMS, DEVICES, AND METHODS". The related application is assigned to Micron Technology, Inc., and is identified as U.S. application Ser. No. 15/878,725, filed Jan. 24, 2018. The subject matter thereof is incorporated herein by reference thereto.

TECHNICAL FIELD

The present technology is related to semiconductor devices, and, in particular, to semiconductor devices with a layered protection mechanism.

BACKGROUND

Semiconductor devices dies, including memory chips, microprocessor chips, and imager chips, typically include a semiconductor die mounted on another structure (e.g., a substrate, another die, etc.) and encased in a plastic protective covering. The die includes functional features, such as for memory cells, processor circuits, and imager devices, as well as interconnects that are electrically connected to the functional features. The interconnects can be electrically connected to terminals outside the protective covering to connect the die to higher level circuitry.

As illustrated in FIG. 1, a semiconductor device 100 (e.g., a three dimensional interconnect (3DI) type of device or a semiconductor package device) can include a die 102 having die interconnects 104 thereon connected to a substrate structure 106 (e.g., a printed circuit board (PCB), a semiconductor or wafer-level substrate, another die, etc.) having substrate interconnects 108 thereon. The die 102 and the substrate structure 106 can be electrically coupled to each other through the die interconnects 104 and the substrate interconnects 108. Further, the die interconnects 104 and the substrate interconnects 108 can be directly contacted each other (e.g., through a bonding process, such as diffusion bonding or hybrid bonding) or through an intermediate structure (e.g., solder). The semiconductor device 100 can further include an encapsulant, such as an underfill 110, surrounding or encapsulating the die 102, the die interconnects 104, the substrate structure 106, the substrate interconnects 108, a portion thereof, or a combination thereof.

With technological advancements in other areas and increasing applications, the market is continuously looking for faster and smaller devices. To meet the market demand, physical sizes or dimensions of the semiconductor devices are being pushed to the limit. For example, efforts are being made to reduce a separation distance between the die 102 and the substrate structure 106 (e.g., for 3DI devices and die-stacked packages).

However, due to various factors (e.g., viscosity level of the underfill 110, trapped air/gases, uneven flow of the underfill 110, space between the interconnects, etc.), the encapsulation process can be unreliable, such as leaving voids 114 between the die 102 and the substrate structure 106 (e.g., with portions of the interconnects failing to directly contact the underfill 110). The voids 114 can cause shorting and leakage between the interconnects (e.g., between the substrate interconnect 108 and/or between the die interconnects 104), causing an electrical failure for the semiconductor device 100. Further, as the device grows smaller, the manufacturing cost can grow (e.g., based on using nano-particle underfill instead of traditional underfill).

DETAILED DESCRIPTION

Figure 1:
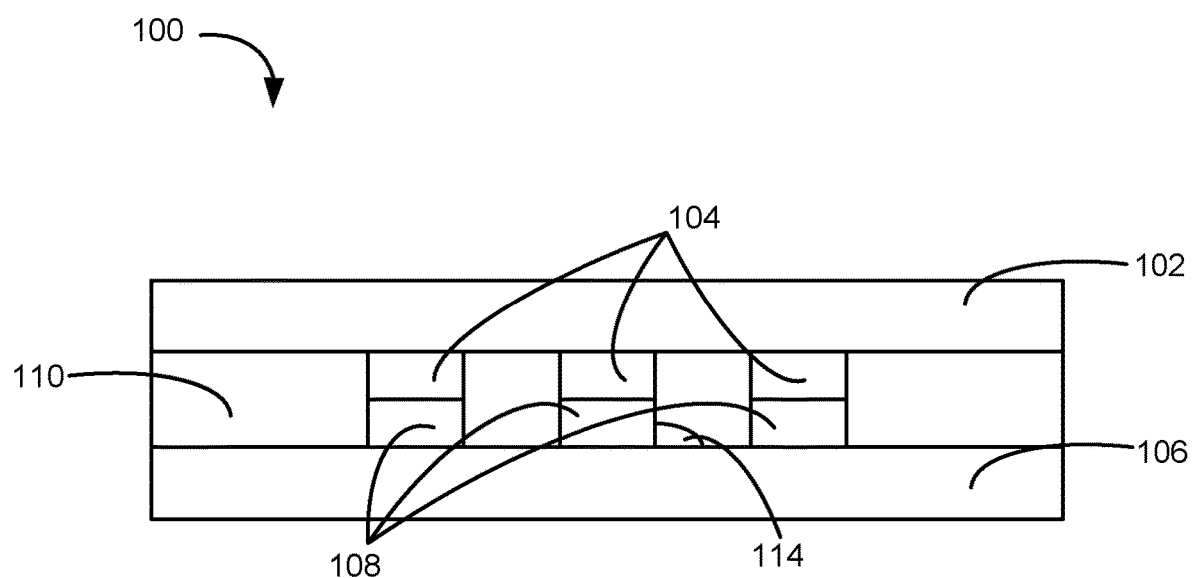
FIG. 1 is a cross-sectional view of a semiconductor device.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a structure that supports electronic components (e.g., a die), such as a wafer-level substrate or a singulated die-level substrate, another die for die-stacking or 3DI applications, or a printed circuit board (PCB). A person having ordinary skill in the relevant art will recognize that suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

Many embodiments of the present technology are described below in the context of protecting the semiconductor dies and the associated electrical connections and further utilizing protection structures to provide capacitance surrounding active signals, such as for shielding the active signals. For example, semiconductor devices (e.g., 3DI packaging solutions) can each include one or more semiconductor dies with die interconnects thereon connected to a substrate structure (e.g., a PCB or another die). To protect the die and the die interconnects (e.g., against environmental factors, such as moisture, debris, etc.), the semiconductor devices can each include multiple metal (e.g., copper, aluminum, alloy, etc.) enclosures that surround the die interconnects along a horizontal plane. The metal enclosures can further extend vertically between and/or directly contact the die and the substrate to enclose the die interconnects and isolate them from exterior environments. As such, the semiconductor devices can use the metal enclosures instead of any encapsulants (e.g., underfills) to isolate the die interconnects from surrounding exterior space and/or environment.

For a set of the metal enclosures surrounding a set of the die interconnects, a first metal enclosure can surround the die interconnects and one or more enclosures (e.g., a second metal enclosure) can surround the first metal enclosure without directly contacting it. In some embodiments, the set of the metal enclosures can be concentrically arranged. In some embodiments, the set of the metal enclosures can be non-concentric.

The set of metal enclosures can be configured to provide a capacitance level. In some embodiments, the semiconductor devices can include an enclosure separation space according to an enclosure separation distance between a pair of adjacent metal enclosures in a set. In some embodiments, the enclosure separation space can be filled with a dielectric material (e.g., forming a dielectric layer) that directly contacts the adjacent metal enclosures. The separation space and/or the dielectric material can provide a capacitance level that surrounds active signals traveling through the die interconnects. For example, one or more of the metal enclosures can be electrically connected to a first voltage level (e.g., ground) and one or more of the other metal enclosures can be electrically connected to a second voltage level (e.g., supply voltage). Accordingly, power delivery can improve through the enclosure capacitance. Also, environmental protection and electrical shielding can improve based on the layered metal enclosures.

In some embodiments, the semiconductor devices can include one or more die stacks that each includes multiple dies. The die stacks can each include a set of metal enclosures disposed between a pair of adjacent dies. Each layer of the metal enclosures (e.g., outer-most enclosure, inner most enclosure, a first middle enclosure, etc.) between different pairs of the adjacent dies can be electrically connected, such as using through-silicon vias (TSVs), conductive paste, wires (e.g., bond wires), or a combination thereof.

Further, one or more metal enclosures can be electrically coupled to conduct electrical signals or an electrical potential (e.g., for providing a ground connection or a source voltage). In some embodiments, the outer-most metal enclosure can be connect to (e.g., via a direct contact or through another conductor) an electro-magnetic interference (EMI) shield. In some embodiments, one or both of the first metal enclosure and the second metal enclosure can be grounded. In some embodiments, the first metal enclosure and the second metal enclosure can be alternatively connected to power and ground (e.g., grounding the outermost ring)

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 2:
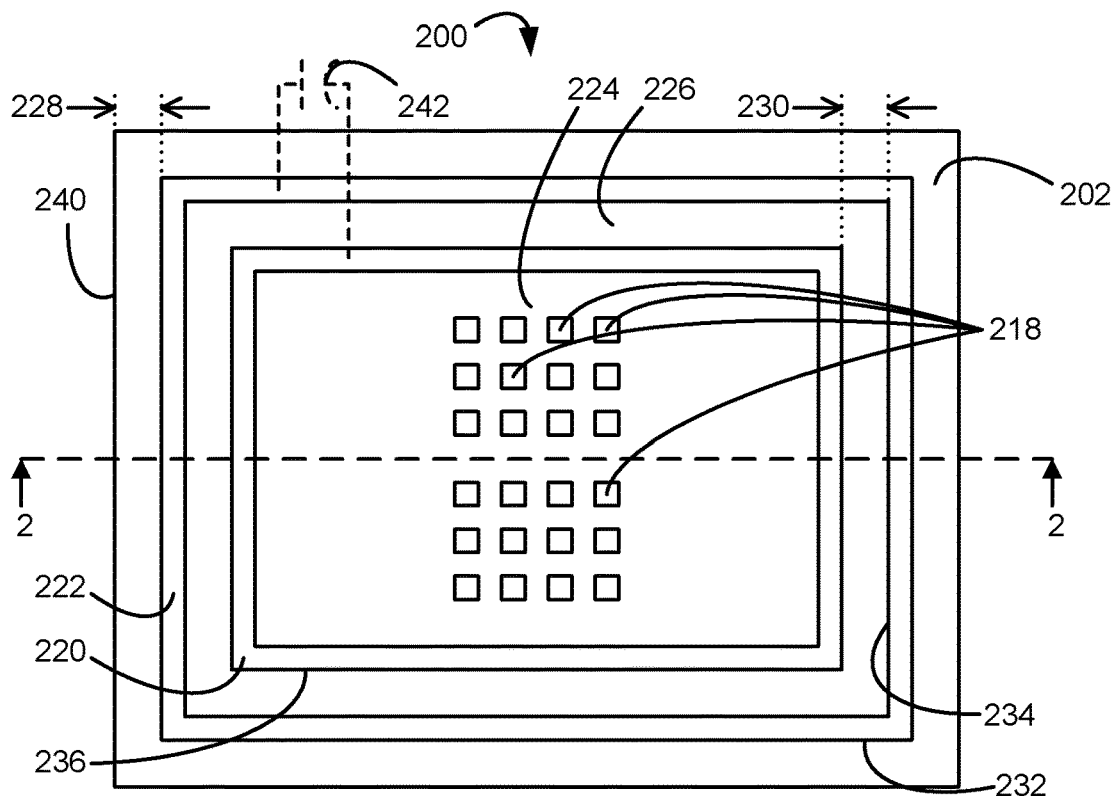
FIG. 2 is a plan view of a semiconductor device in accordance with an embodiment of the present technology.

FIG. 2 is a plan view of a semiconductor device 200 (e.g., a semiconductor die assembly, including a 3DI device or a die-stacked package) in accordance with an embodiment of the present technology. The semiconductor device 200 can include one or more semiconductor dies mounted on or connected to a substrate (e.g., another die or a PCB). For example, the semiconductor device 200 can include a semiconductor die 202 ("die 202"). Between the dies, such as above and/or below the die 202, the semiconductor device 200 can include internal interconnects 218 configured to directly connect and electrically couple the structures (e.g., dies and/or the PCB). In some embodiments, the internal interconnects 218 can be structures resulting from bonding or joining (e.g., such as through diffusion bonding or hybrid bonding) pillars, pads, or interconnect structures.

The semiconductor device 200 can further include one or more metal (e.g., copper, aluminum, alloy, etc.) enclosures surrounding/encircling a periphery or a perimeter of the internal interconnects 218 along a plane. For example, the semiconductor device 200 can include at least a first metal enclosure 220 ("first enclosure 220") and a second metal enclosure 222 ("second enclosure 222"). In some embodiments, the first enclosure 220 can be an inner enclosure that surrounds the internal interconnects 218, and the second enclosure 222 can surround the first enclosure 220, both along a horizontal plane. The first enclosure 220 can be nested within the second enclosure 222 without directly contacting each other.

The first enclosure 220 and the second enclosure 222 can each be a continuous and solid metallic, such as copper or solder, structure that forms a wall peripherally surrounding the internal interconnects 218. In some embodiments, the first enclosure 220 and the second enclosure 222 (e.g., solid copper or solder structures) can be formed through a bonding process (e.g., diffusion boding process, thermal compression bonding, mass reflow, etc.). In some embodiments, the first enclosure 220 and the second enclosure 222 can each have a vertical dimension or a height that is less than or equal to 20 µm. In some embodiments, the first enclosure 220 and the second enclosure 222 can be concentrically arranged. In some embodiments, the enclosures can include solder that can be bonded through thermal compression bonding or mass reflow.

Between the dies or between a die and a PCB substrate, the first enclosure 220, the second enclosure 222, or a combination thereof can function as horizontal or periphery boundaries (e.g., such as vertical structures/planes marking peripheral edges along a horizontal plane) for an internal space 224 ("enclosed space 224"). The enclosed space 224 can be vacuum or filled with inert/specific gas and/or other dielectric material except for the internal interconnects 218 (e.g., without any encapculant material or underfill therein). Accordingly, the first enclosure 220 and/or the second enclosure 222 can isolate the internal interconnects 218 from external space on the opposite side of the enclosures.

In some embodiments, a pair of the enclosures (e.g., the first enclosure 220 and the second enclosure 222) can be separated by an enclosure separation space 226. For example, the enclosure separation space 226 can be the space between the first enclosure 220 and the second enclosure 222. As illustrated in FIG. 2, the enclosed space 224 can be the space within the first enclosure 220, and the enclosure separation space 226 can be a space surrounding the first enclosure 220 with the second enclosure 222 forming the periphery boundary. In some embodiments, the enclosed space 224 can be the space that is surrounded by the second enclosure 222, and the enclosure separation space 226 can be an outer periphery portion of the enclosed space 224.

In some embodiments, the enclosures (e.g., the outer-most enclosure, such as the second enclosure 222 as illustrated in FIG. 2) can be located at an edge offset distance 228 (e.g., a distance measured along a horizontal direction) from a die periphery edge 240. For example, the edge offset distance 228 can be the distance between the die periphery edge 240 and a second exterior surface 232 (e.g., the outer peripheral surface of the second enclosure 222) along a horizontal direction. In some embodiments, the outer-most enclosure can be located such that an edge or a surface thereof is coplanar or coincident with the die periphery edge 240 along a vertical plane or line (e.g., where the edge offset distance 228 is 0).

In some embodiments, the enclosures can be separated by an enclosure separation distance 230. For example, the enclosure separation distance 230 can be the distance between a second interior surface 234 (e.g., the inner peripheral surface of the second enclosure 222) and a first exterior surface 236 (e.g., the outer peripheral surface of the first enclosure 220) along a horizontal direction. The enclosure separation distance 230 can correspond to the enclosed space 224.

The semiconductor device 200 can have the enclosure separation distance 230 and the enclosures (e.g., the first enclosure 220 and the second enclosure 222) configured to provide an enclosure capacitance 242. The enclosure capacitance 242 can provide electrical capacitance that surrounds the internal interconnects 218 and/or the active signals. For example, one or more of the enclosures (e.g., the second enclosure 222 or the first enclosure 220) can be connected to a first voltage level (e.g., ground) and one or more of the other enclosures (e.g., the first enclosure 220 or the second enclosure 222) can be connected to a second voltage level (e.g., supply voltage). Further, the enclosure capacitance 242 can be based on the enclosure separation distance 230 and/or gas/vacuum/dielectric material in the enclosure separation space 226.

The enclosures separated by the enclosure separation distance 230 and configured to provide the enclosure capacitance 242 can improve radio frequency (RF) shielding and increase the package-level capacitance. The enclosure capacitance 242 can also improve circuit integrity for high-current-surge devices.

The enclosures can further provide decrease in overall size of the semiconductor device. Because underfill is not necessary, the bond line thickness can be reduced, leading to a very low packaging height for multiple-die stacking. Further, the enclosures that exclude solder (e.g., solid copper structure, such as resulting from Cu—Cu diffusion bonding) provide decrease in manufacturing cost by eliminating pillar bumping. Also, the enclosure that exclude solder provide reduction in failure rates by providing clean joints without solder caps, thereby removing failure modes associated with solder bridging, slumping, starvation, intermetallic compound (IMC), electromagnetic (EM) effect, etc.

The enclosures also provide decrease in manufacturing cost and failure rates as the package height is decreased. The enclosures can protect and isolate the internal interconnects 218 from environmental factors (e.g., moisture, debris, etc.), which eliminates the need for underfills (e.g., nano-particle underfills). Accordingly, the costs and the error rates associated with underfill laminate or flowing process, both of which increases rapidly as the space between the adjacent dies decreases, can be eliminated based on using the enclosures to replace the underfill. Further, the enclosures provide a joint that satisfies mechanical, thermal, and electrical traits or benefits previously provided by the underfill.

For illustrative purposes, the enclosure is shown having a rectangular shape, uniform thickness or width, and concentric with a shape or outline of a corresponding die. However, it is understood that the enclosures can be different. For example, the enclosures can have an oval shape, an irregular or asymmetrical shape, or any N-sided polygonal shape. Also for example, the enclosures can have varying thickness or width at different portions. Also for example, the enclosures can be offset or non-concentric with respect to the internal interconnects 218 or an arrangement thereof, the shape or outline of the die, or a combination thereof.

Figure 3:
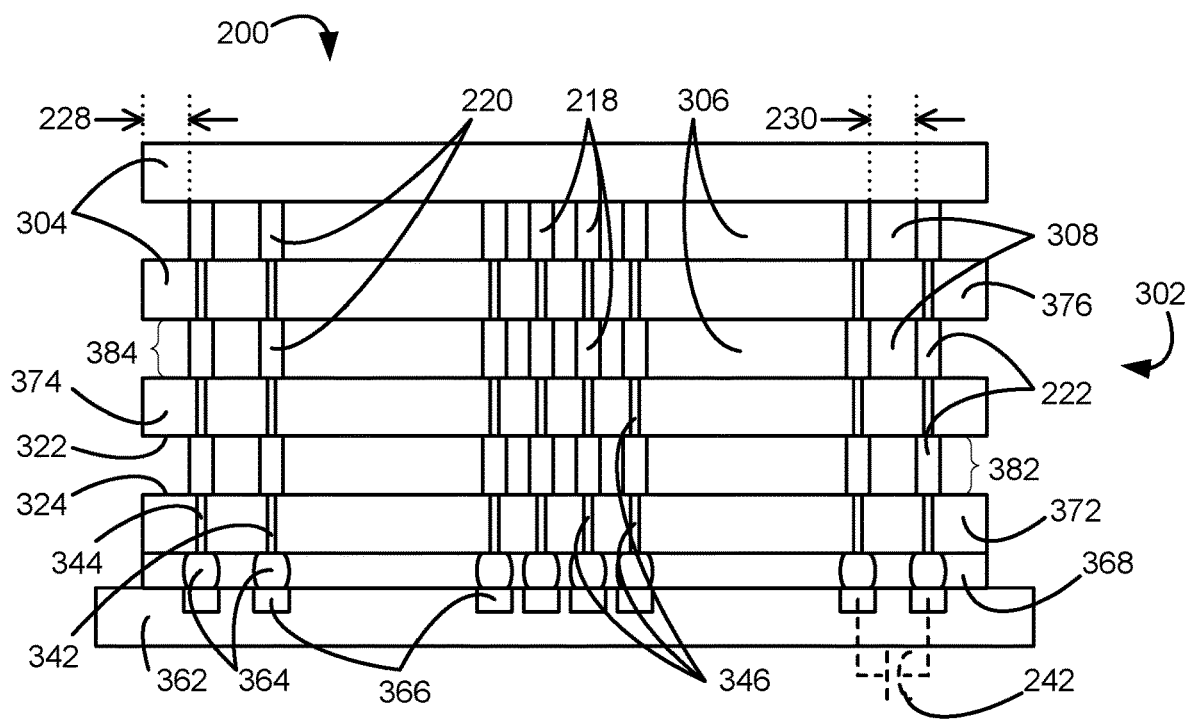
FIG. 3 is a cross-sectional view taken along line 2-2 of FIG. 2 for a semiconductor device in accordance with an embodiment of the present technology.

FIG. 3 is a cross-sectional view taken along line 2-2 of FIG. 2 for a semiconductor device in accordance with an embodiment of the present technology. The semiconductor device 200 can include one or more semiconductor dies mounted on or connected to a substrate (e.g., another die or a PCB). For example, the semiconductor device 200 can include a die stack 302 that includes multiple semiconductor dies 304 ("dies 304") with the first enclosure 220 and the second enclosure 222 disposed between one or more pairs of adjacent dies. Between the one or more pairs of adjacent dies, the first enclosure 220 and/or the second enclosure 222 can surround enclosed spaces 306 (e.g., instances of the enclosed space 224 of FIG. 2), and enclosure separation spaces 308 (e.g., instances of the enclosure separation space 226 of FIG. 2) can be formed by the first enclosure 220 and the second enclosure 222, both along the horizontal direction. Along the vertical direction, a first boundary surface 322 and a second boundary surface 324 of opposing adjacent dies can form boundaries for the enclosed spaces 306 and the enclosure separation spaces 308. The enclosed spaces 306 and/or the enclosure separation spaces 308 can be vacuum or filled with inert/specific gas or other dielectric material as discussed above.

In some embodiments, the die stack 302 can include TSVs in one or more of the dies 304 for electrically coupling circuits/components across or through the corresponding dies. The internal interconnects 218 can be connected to (e.g., through direct contact and/or through another electrical conductor, such as a trace) to one or more TSVs, such as inner TSVs and/or periphery TSVs. Further, one or more TSVs can electrically connect one or more metal enclosures to an electrical signal or potential (e.g., electrical ground or supply voltage).

For example, one or more of the dies can include one or more first periphery TSVs 342 and/or one or more second periphery TSVs 344 located on peripheral portion(s) of the corresponding dies. The first periphery TSVs 342 and the second periphery TSVs 344 can be for electrically coupling the first enclosure 220 and/or the second enclosure 222 across the dies and/or to the electrical signal/potential. As illustrated in FIG. 3, the first periphery TSVs 342 can directly contact and electrically couple instances of the first enclosure 220 across (e.g., such as by electrically connecting through) a die, and the second periphery TSVs 344 can directly contact and electrically couple instances of the second enclosure 222 across a die. Also for example, one or more of the dies can include one or more inner TSVs 346 located on an inner or central portion of the corresponding dies. As illustrated in FIG. 3, the inner TSVs 346 can directly contact and electrically couple instances of the internal interconnects 218 across a die.

The semiconductor device 200 can include the die stack 302 attached to/over a device substrate 362 (e.g., PCB). The device substrate 362 can include bond pads 366 for electrically coupling to the die stack 302. For example, the semiconductor device 200 can include device interconnects 364 (e.g., solder) directly contacting the bond pads 366 and one or more of the TSVs for electrically coupling the die stack 302 to the device substrate 362 and/or other electrical components/circuits. In some embodiments, the device interconnects 364 can be embedded in underfill/encapsulant 368 ("underfill 368") disposed between a bottom surface of the die stack 302 and a top surface of the device substrate 362. In some embodiments, one or more metal enclosures can replace the underfill 368, and/or the internal interconnects 218 can replace the device interconnects 364.

In some embodiments, the TSVs can electrically connect the enclosures as sets. For example, the die stack 302 can include a first die 372 (e.g., lower most die, such as the die directly contacting the device interconnects 364, the underfill 368, etc.), a second die 374 attached directly over the first die 372, a third die 376 attached directly over the second die 374, etc. The semiconductor device 200 can include a first-level enclosure group 382 (e.g., the first enclosure 220 and the second enclosure 222) between the first die 372 and the second die 374, a second-level enclosure group 384 (e.g., an additional/second set of the first enclosure 220 and the second enclosure 222), etc.

For such arrangement, the first periphery TSVs 342 can connect one or more inner enclosures (e.g., instances of the first enclosure 220) along a vertical direction, and the second periphery TSVs 344 can connect one or more outer/periphery enclosures (e.g., instances of the second enclosure 222) along a vertical direction. In some embodiments, all vertically corresponding enclosures in the die stack can be electrically connected together. For example, all inner enclosures can be electrically coupled together, such as using the first periphery TSVs 342, and/or all outer enclosures can be electrically coupled together, such as using the second periphery TSVs 344.

In some embodiments, the enclosures can be aligned for the vertical connections. For example, center portions and/or periphery edges/portions/surfaces of inner enclosures across the different level enclosure groups can be coincident along a vertical line/plane. Also for example, center portions and/or periphery edges/portions/surfaces of outer enclosures across the different level enclosure groups can be coincident along a vertical line/plane.

Using electrical connectors (e.g., traces, the bond pads 366, the device interconnects 364, or a combination thereof) and the TSVs, the enclosures can each be connected to a voltage level (e.g., electrical ground, supply voltage, etc.). Accordingly, the enclosures can be used to provide the enclosure capacitance 242 across a horizontal direction or across the dies.

Additionally, vertically connecting the multiple enclosures across dies (e.g., along a vertical direction as shown in FIG. 3, such as connecting the first-level enclosure group 382 to the second-level enclosure group 384) can further increase the enclosure capacitance 242 for the semiconductor device 200. Using the periphery TSVs to vertically connect multiple enclosures can increase surface area and/or mass capable of holding electrical charges. Accordingly, the enclosure capacitance 242 and package-level capacitance can increase based on connecting the enclosures across the dies. As a result, the vertically connected enclosures (e.g., an inner set and an outer set of enclosures) can further improve the RF shielding capacity.

Figure 4:
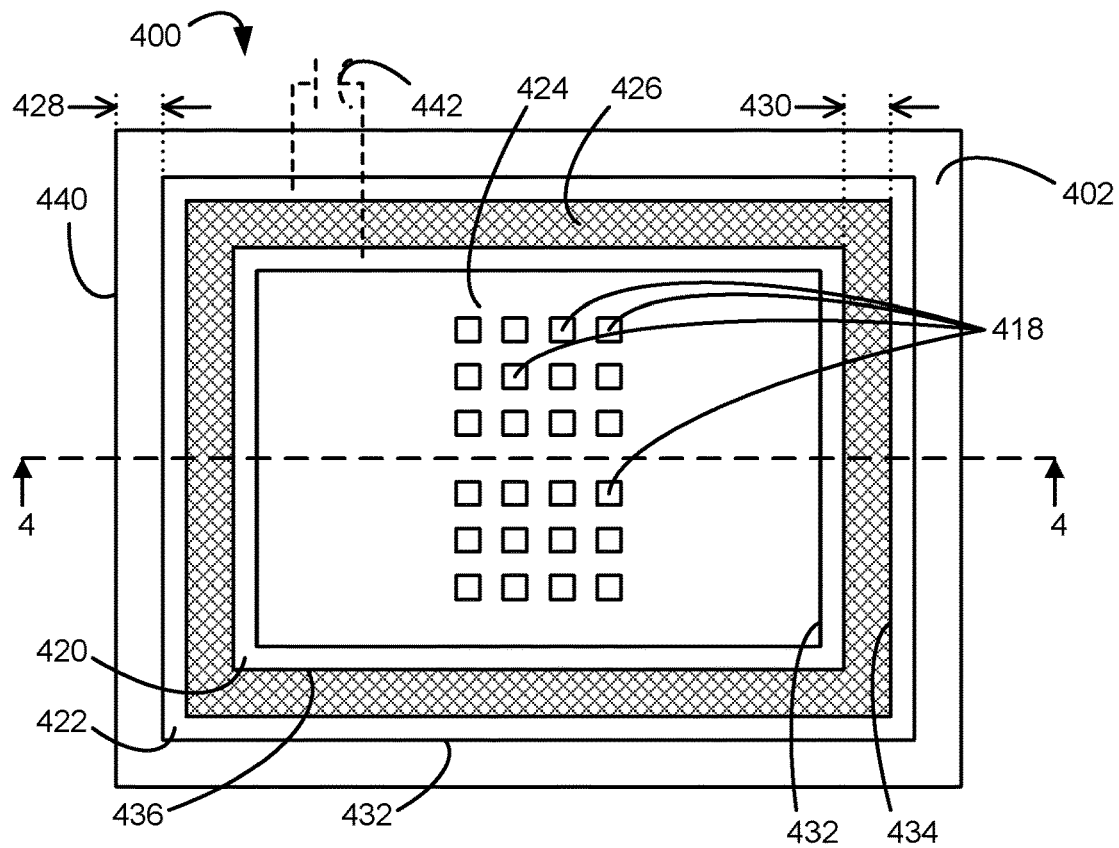
FIG. 4 is a plan view of a semiconductor device in accordance with an embodiment of the present technology.

FIG. 4 is a plan view of a semiconductor device 400 (e.g., a semiconductor die assembly, including a 3DI device or a die-stacked package) in accordance with an embodiment of the present technology. The semiconductor device 400 can be similar to the semiconductor device 200 of FIG. 2, but with dielectric material filling an enclosure space between the metal enclosures.

For example, the semiconductor device 400 can include one or more semiconductor dies, including a semiconductor die 402 ("die 402") illustrated in FIG. 4, mounted on or connected to a substrate (e.g., another die or a PCB). Also for example, the semiconductor device 400 can include internal interconnects 418 (e.g., structures resulting from bonding or joining, such as through diffusion bonding or hybrid bonding, pillars, pads, or interconnect structures) configured to directly connect and electrically couple the circuits on different structures (e.g., dies and/or the PCB).

Also for example, the semiconductor device 400 can further include one or more continuous and solid metal (e.g., copper, aluminum, alloy, etc.) enclosures (e.g., a first metal enclosure 420 ("first enclosure 420"), a second metal enclosure 422 ("second enclosure 422"), etc.) that each forms a wall surrounding/encircling a periphery or a perimeter of the internal interconnects 418 along a plane. In some embodiments, the first enclosure 420 can be an inner enclosure (e.g., a nested enclosure) that peripherally surrounds the internal interconnects 418 and is nested within the second enclosure 422 that peripherally surrounds the first enclosure 420, both along a horizontal plane. In some embodiments, the first enclosure 420 and the second enclosure 422 (e.g., solid copper structures) can be formed through a diffusion bonding process. In some embodiments, the first enclosure 420 and the second enclosure 422 can each have a vertical dimension or a height that is less than or equal to 40 μm. In some embodiments, the first enclosure 420 and the second enclosure 422 can be concentrically arranged.

Between the dies or between a die and a PCB substrate, the first enclosure 420, the second enclosure 422, or a combination thereof can function as horizontal or periphery boundaries (e.g., such as vertical structures/planes marking peripheral edges along a horizontal plane) for an internal space 424 ("enclosed space 424"). The enclosed space 424 can be vacuum or filled with inert/specific gas and/or other dielectric material except for the internal interconnects 418

(e.g., without any encapculant material or underfill therein). Accordingly, the first enclosure 420 and/or the second enclosure 422 can isolate the internal interconnects 418 from external space on the opposite side of the enclosures.

In some embodiments, the enclosures (e.g., the outer-most enclosure, such as the second enclosure 422 as illustrated in FIG. 4) can be located at an edge offset distance 428 (e.g., a distance measured along a horizontal direction) from a die periphery edge 440. For example, the edge offset distance 428 can be the distance between the die periphery edge 440 and a second exterior surface 432 (e.g., the outer peripheral surface of the second enclosure 422) along a horizontal direction. In some embodiments, the outer-most enclosure can be located such that an edge or a surface thereof is coplanar or coincident with the die periphery edge 440 along a vertical plane or line (e.g., where the edge offset distance 428 is 0).

In some embodiments, the enclosures can be separated by an enclosure separation distance 430. For example, the enclosure separation distance 430 can be the distance between a second inner surface 434 (e.g., the inner peripheral surface of the second enclosure 422) and a first exterior surface 436 (e.g., the outer peripheral surface of the first enclosure 420) along a horizontal direction. The enclosure separation distance 430 can correspond to the enclosed space 424.

The semiconductor device 400 can have the enclosure separation distance 430 and the enclosures (e.g., the first enclosure 420 and the second enclosure 422) configured to provide an enclosure capacitance 442. The enclosure capacitance 442 can provide electrical capacitance that surrounds the internal interconnects 418 and/or the active signals. For example, one or more of the enclosures (e.g., the second enclosure 422 or the first enclosure 420) can be connected to a first voltage level (e.g., ground) and one or more of the other enclosures (e.g., the first enclosure 420 or the second enclosure 422) can be connected to a second voltage level (e.g., supply voltage).

In some embodiments, a pair of the enclosures (e.g., the first enclosure 420 and the second enclosure 422) can be separated by an enclosure separation space (e.g., the space between the first enclosure 420 and the second enclosure 422) that is filled by a dielectric material 426 (e.g., an electrical insulator that can be polarized by an applied electrical field). As illustrated in FIG. 4, the dielectric material 426 can be between the first enclosure 420 and the second enclosure 422 and directly contact both the first enclosure 420 and the second enclosure 422. For example, the dielectric material 426 can be between and directly contact the first exterior surface 436 and the second inner surface 434.

Along with the enclosure separation distance 430, the dielectric material 426 can be configured to achieve a desired level of the enclosure capacitance 442. The dielectric material 426 between the first enclosure 420 and the second enclosure 422 can increase the enclosure capacitance 442 in comparison to leaving the enclosure separation space vacuum or filled with gases.

The enclosures separated by the enclosure separation distance 430 and filled with the dielectric material 426 for providing the enclosure capacitance 442 can improve radio frequency (RF) shielding and increase the package-level capacitance. The enclosure capacitance 442 can also improve circuit integrity for high-current-surge devices.

Figure 5:
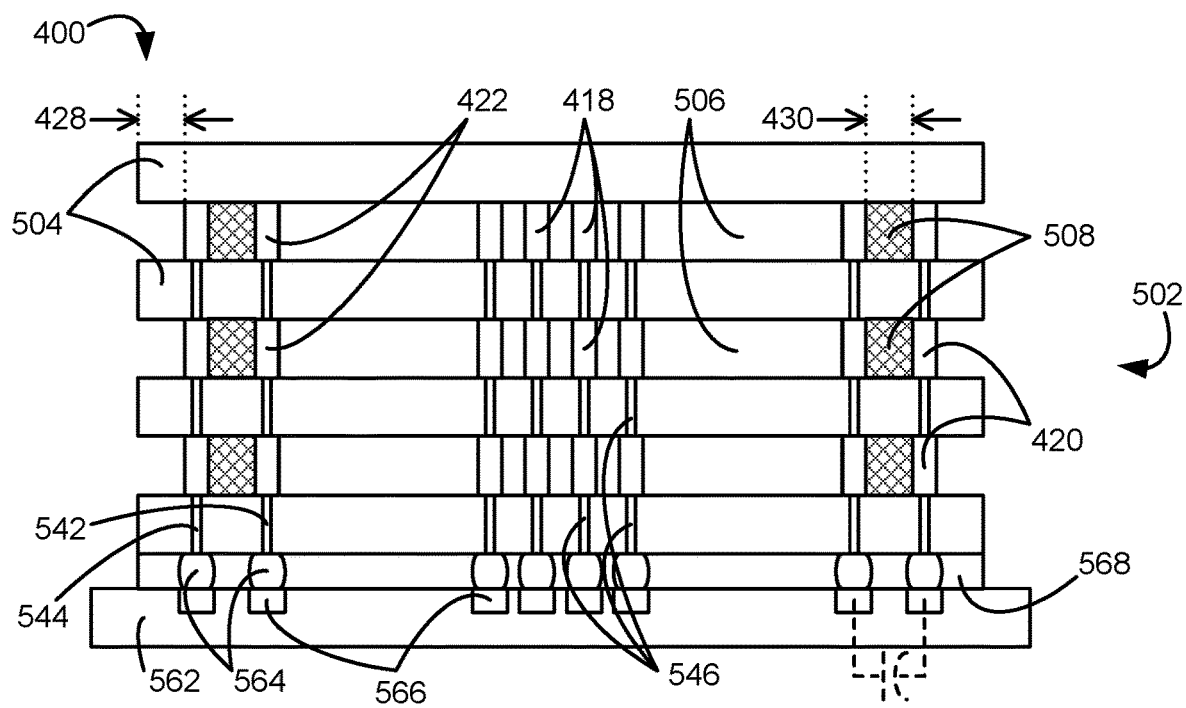
FIG. 5 is a cross-sectional view taken along line 4-4 of FIG. 4 for a semiconductor device in accordance with an embodiment of the present technology.

FIG. 5 is a cross-sectional view taken along line 4-4 of FIG. 4 for a semiconductor device in accordance with an embodiment of the present technology. Similar to the semiconductor device 200 of FIG. 2, the semiconductor device 400 can include one or more semiconductor dies mounted on or connected to a substrate (e.g., another die or a PCB). For example, the semiconductor device 400 can include a die stack 502 that includes multiple semiconductor dies 504 ("dies 504") with the first enclosure 420 and the second enclosure 422 disposed between one or more pairs of adjacent dies. Further, the semiconductor device 400 can include enclosed spaces 506 (e.g., instances of the enclosed space 424 of FIG. 4) and dielectric materials 508 (e.g., instances of the dielectric material 426 of FIG. 4) between the one or more pairs of adjacent dies.

In some embodiments, the die stack 502 can include TSVs in one or more of the dies 504 for electrically coupling circuits/components across or through the corresponding dies. For example, one or more of the dies can include one or more first periphery TSVs 542 and/or one or more second periphery TSVs 544 located on peripheral portion(s) of the corresponding dies. As illustrated in FIG. 5, the first periphery TSVs 542 can directly contact and electrically couple instances of the first enclosure 420 across a die, and the second periphery TSVs 544 can directly contact and electrically couple instances of the second enclosure 422 across a die. Also for example, one or more of the dies can include one or more inner TSVs 546 located on an inner or central portion of the corresponding dies. The inner TSVs 546 can directly contact and electrically couple instances of the internal interconnects 418 across a die.

The semiconductor device 400 can include the die stack 502 attached to/over a device substrate 562 (e.g., PCB). The device substrate 562 can include bond pads 566 for electrically coupling to the die stack 502. For example, the semiconductor device 400 can include device interconnects 564 (e.g., solder) directly contacting the bond pads 566 and one or more of the TSVs for electrically coupling the die stack 502 to the device substrate 562 and/or other electrical components/circuits. In some embodiments, the device interconnects 564 can be embedded in underfill/encapsulant 568 ("underfill 568") disposed between a bottom surface of the die stack 502 and a top surface of the device substrate 562. In some embodiments, one or more metal enclosures can replace the underfill 568, and/or the internal interconnects 418 can replace the device interconnects 564.

Using electrical connectors (e.g., traces, the bond pads 566, the device interconnects 564, or a combination thereof) and the TSVs, the enclosures can each be connected to a voltage level (e.g., electrical ground, supply voltage, etc.). Accordingly, the enclosures can be used to provide the enclosure capacitance 442 across a horizontal direction or across the dies.

Additionally, vertically connecting the multiple enclosures across dies (e.g., along a vertical direction as shown in FIG. 5) can further increase the enclosure capacitance 442 for the semiconductor device 400. Using the periphery TSVs to vertically connect multiple enclosures can increase surface area and/or mass capable of holding electrical charges. Accordingly, the enclosure capacitance 442 and package-level capacitance can increase based on connecting the enclosures across the dies. As a result, the vertically connected enclosures (e.g., an inner set and an outer set of enclosures) can further improve the RF shielding capacity.

Figure 6:
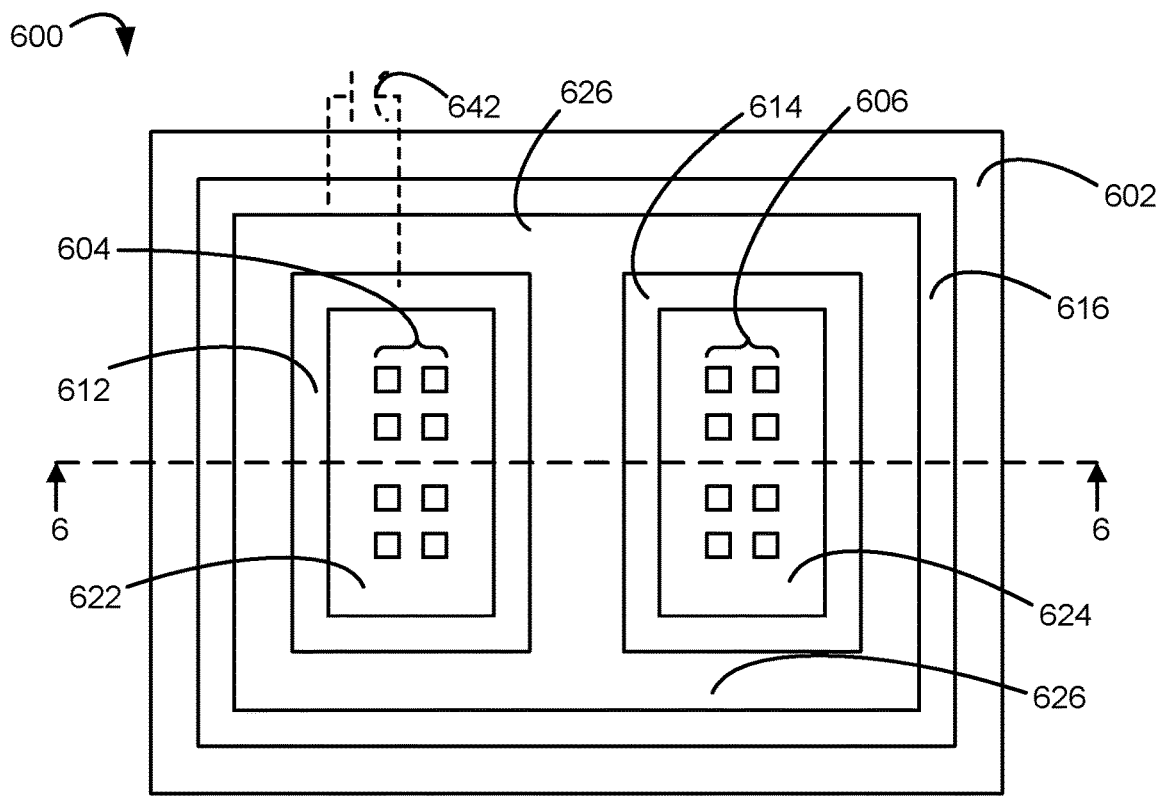
FIG. 6 is a plan view of a semiconductor device in accordance with an embodiment of the present technology.

FIG. 6 is a plan view of a semiconductor device 600 (e.g., a semiconductor die assembly, including a 3DI device or a die-stacked package) in accordance with an embodiment of the present technology. The semiconductor device 600 can be similar to the semiconductor device 200 of FIG. 2 and/or the semiconductor device 400 of FIG. 4, but with multiple non-overlapping internal metal enclosures nested within an outer metal enclosure.

For example, the semiconductor device 600 can include one or more semiconductor dies, including a semiconductor die 602 ("die 602") illustrated in FIG. 6, mounted on or connected to a substrate (e.g., another die or a PCB). Also for example, the semiconductor device 600 can include internal interconnects, such as structures resulting from bonding or joining, such as through diffusion bonding or hybrid bonding, pillars, pads, or interconnect structures. In some embodiments, the semiconductor device 600 can include separate sets of interconnects, such as a first interconnect set 604 and a second interconnect set 606, configured to directly connect and electrically couple the circuits on different structures (e.g., dies and/or the PCB).

Also for example, the semiconductor device 600 can further include one or more continuous and solid metal (e.g., copper, aluminum, alloy, etc.) enclosures that each forms a wall surrounding/encircling a periphery or a perimeter of interconnects and/or other enclosures along a plane (e.g., horizontal plane). In some embodiments, the semiconductor device 600 can include multiple non-overlapping inner metal enclosures (e.g., a first inner enclosure 612 and a second inner enclosure 614) nested within an outer encompassing metal enclosure (e.g., an outer enclosure 616). The first inner enclosure 612 can surround/encircle the first interconnect set 604 and the second inner enclosure 614 can surround/encircle the second interconnect set 606. The outer enclosure 616 can surround/encircle the inner enclosures (e.g., the first inner enclosure 612 and the second inner enclosure 614) nested therein and the sets of the interconnects (e.g., the first interconnect set 604 and the second interconnect set 606) enclosed/surrounded therein.

Between the dies or between a die and a PCB substrate, the enclosures can function as horizontal or periphery boundaries (e.g., such as vertical structures/planes marking peripheral edges along a horizontal plane) for enclosed spaces. The outer enclosure can encircle a space, and the inner enclosures can encircle separate and exclusive spaces therein. For example, the outer enclosure 616 can encircle an outer enclosed space 626. The first inner enclosure 612 can encircle a first inner space 622, and the second inner enclosure 614 can encircle a second inner space 624 that is separate and exclusive from the first inner space 622. Both the first inner space 622 and the second inner space 624 can be spaces/portions within the outer enclosed space 626.

The enclosed spaces can be vacuum or filled with inert/specific gas (e.g., without any encapculant material or underfill therein). In some embodiments, portions of the enclosed spaces between the enclosures can be filled with dielectric material (e.g. the dielectric material 426 of FIG. 4). Accordingly, the enclosures can isolate the interconnects from external space on the opposite side of the structures.

In some embodiments, the inner enclosures can be separated without any direct contacts. In some embodiments, the inner enclosures can be electrically connected together or share/overlap portions therein. In some embodiments, the enclosures (e.g., solid copper structures) can be formed through a diffusion bonding process. In some embodiments, the enclosures can each have a vertical dimension or a height that is less than or equal to 60 μm.

In some embodiments, the outer enclosure 616 can be located coplanar with a periphery edge/surface of the die. In some embodiments, the outer enclosure 616 can be horizontally offset from the periphery edge/surface as discussed above.

The inner enclosures can be separated from the outer enclosure by one or more enclosure separation distances similar to the enclosure separation distance discussed above. For example, the first inner enclosure 612 can correspond to a first separation distance and the second inner enclosure 614 can correspond to a second separation distance, both relative to the outer enclosure 616.

The semiconductor device 600 can have the enclosure separation distances and the enclosures configured to provide enclosure capacitances 642. The enclosure capacitances 642 can provide electrical capacitances that each surrounds a set of the internal interconnects and/or the active signals. Together with the separation distances, dielectric fillers, etc., the electrical connections for the enclosures can be configured to achieve desired levels of the enclosure capacitances 642 surrounding each set of the active signals. For example, one or more of the enclosures (e.g., the outer enclosure 616) can be connected to a first voltage level (e.g., ground) and one or more of the other enclosures (e.g., the inner enclosures) can be connected to a different voltage level (e.g., supply voltage or differing voltage levels). The resulting capacitances encircling active signals/circuits can improve radio frequency (RF) shielding and increase the package-level capacitance. The enclosure capacitances 642 can also improve circuit integrity for high-current-surge devices.

Figure 7:
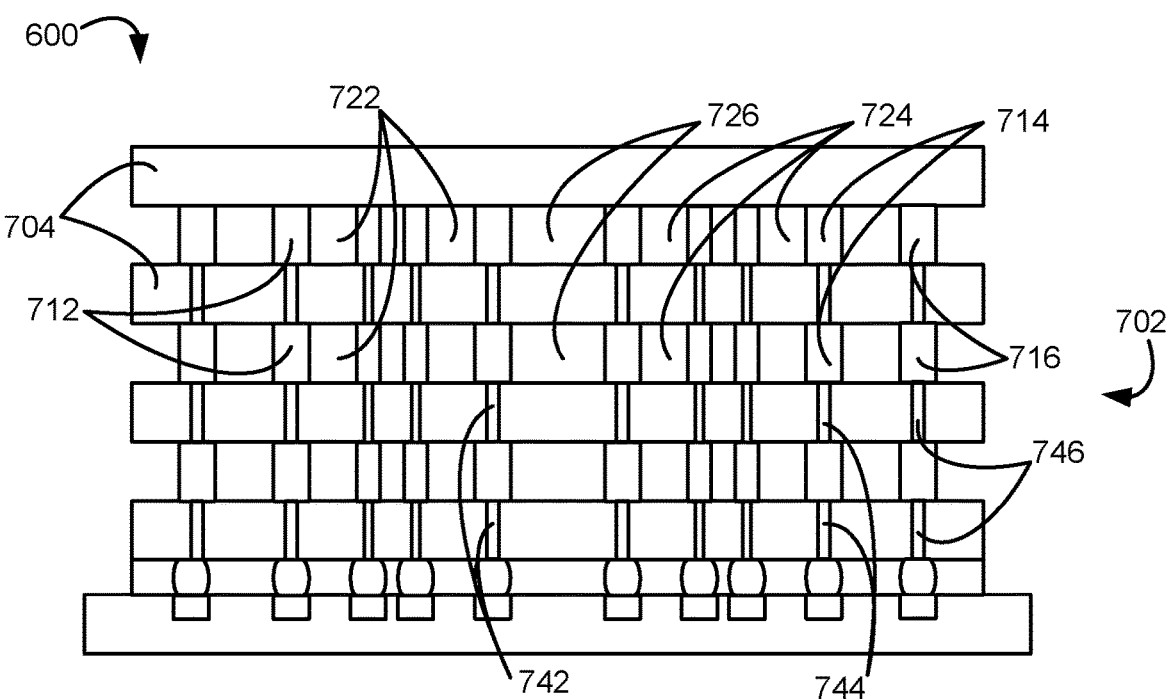
FIG. 7 is a cross-sectional view taken along line 6-6 of FIG. 6 for a semiconductor device in accordance with an embodiment of the present technology.

FIG. 7 is a cross-sectional view taken along line 6-6 of FIG. 6 for a semiconductor device in accordance with an embodiment of the present technology. Similar to the semiconductor device 200 of FIG. 2 and/or the semiconductor device 400 of FIG. 4, the semiconductor device 600 can include one or more semiconductor dies mounted on or connected to a substrate (e.g., another die or a PCB). For example, the semiconductor device 600 can include a die stack 702 that includes multiple semiconductor dies 704 ("dies 704") with enclosures, such as first inner enclosures 712 (e.g., instances of the first inner enclosure 612 of FIG. 6), second inner enclosures 714 (e.g., instances of the second inner enclosure 614 of FIG. 6), outer enclosures 716 (e.g., instances of the outer enclosure 616 of FIG. 6), etc., disposed between one or more pairs of adjacent dies. Further, the semiconductor device 600 can include enclosed spaces, such as first inner spaces 722 (e.g., instances of the first inner space 622 of FIG. 6), second inner spaces 724 (instances of the second inner space 624 of FIG. 6), outer enclosed spaces 726 (instances of the outer enclosed space 626 of FIG. 6), etc., between the one or more pairs of adjacent dies.

In some embodiments, the die stack 702 can include TSVs in one or more of the dies 704 for electrically coupling circuits/components across or through the corresponding dies. For example, one or more of the dies can include one or more first-enclosure TSVs 742, one or more second-enclosure TSVs 744, one or more outer-enclosure TSVs 746, one or more interconnect TSVs, etc. The first-enclosure TSVs 742 can directly contact and electrically couple adjacent pair of the first inner enclosures 712 across a corresponding die, the second-enclosure TSVs 744 can directly contact and electrically couple adjacent pair of the second inner enclosures 714 across a corresponding die, and the outer-enclosure TSVs 746 can directly contact and electrically couple adjacent pair of the outer enclosures 716 across a corresponding die. Similarly, the interconnect TSVs can directly contact and electrically couple corresponding sets of the internal interconnects across a die.

Similar to the semiconductor devices discussed above, the semiconductor device 600 can include the die stack 702 attached to/over a device substrate (e.g., PCB). The device substrate can include bond pads, device interconnects (e.g., solder) for electrically coupling to the die stack 702. In some embodiments, the device interconnects can be embedded in underfill/encapsulant disposed between a bottom surface of the die stack 702 and a top surface of the device substrate. In some embodiments, one or more metal enclosures can replace the underfill, and/or the internal interconnects can replace the device interconnects.

Using electrical connectors (e.g., traces, the bond pads, the device interconnects, or a combination thereof) and the TSVs, the enclosures can each be connected to a voltage level (e.g., electrical ground, supply voltage, etc.). Accordingly, the enclosures can be used to provide the enclosure capacitances 642 across a horizontal direction or across the dies.

Additionally, vertically connecting the multiple enclosures across dies (e.g., along a vertical direction as shown in FIG. 5) can further increase the enclosure capacitance 442 for the semiconductor device 400. Using the periphery TSVs to vertically connect multiple enclosures can increase surface area and/or mass capable of holding electrical charges. Accordingly, the enclosure capacitance 442 and package-level capacitance can increase based on connecting the enclosures across the dies. As a result, the vertically connected enclosures (e.g., an inner set and an outer set of enclosures) can further improve the RF shielding capacity.

Figure 8:
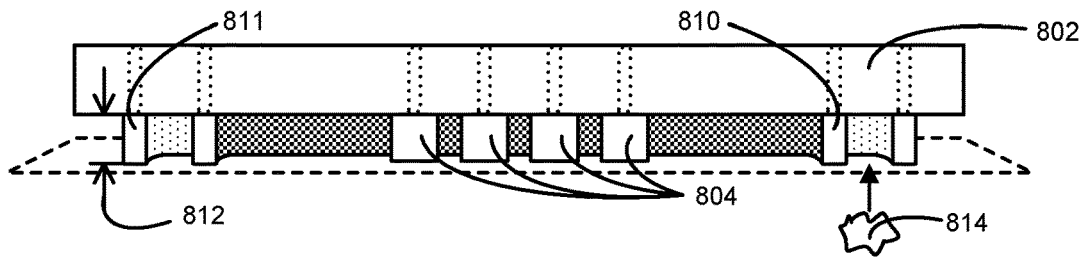
FIGS. 8-11 are cross-sectional views illustrating a semiconductor device at selected stages in a manufacturing method in accordance with an embodiment of the present technology.

FIGS. 8-11 are cross-sectional views illustrating a semiconductor device at selected stages in a manufacturing method in accordance with an embodiment of the present technology. As illustrated in FIG. 8, the method can include a stage for providing a first die 802. The first die 802 can include first-die interconnects 804 (e.g., solid metal structures for providing electrical connections to circuits within the first die 802, such as for a portion of the internal interconnects) protruding below a first die bottom surface. The first die 802 can further include one or more first-die inner enclosures (e.g., a first-die inner enclosure 810) and a first-die outer enclosure 811. The first-die inner enclosures and the first-die outer enclosure 811 can each be a solid metal structure, such as for a portion of the metal enclosure structure. The first-die inner enclosures can each encircle a perimeter of the corresponding die interconnects (e.g., the first-die interconnects 804) along a horizontal plane, and the first-die outer enclosure 811 can encircle the first-die inner enclosure 810 along a horizontal plane.

The first die 802 with the first-die interconnects 804 and the die enclosures can be manufactured using a separate manufacturing process (e.g., wafer or die level manufacturing process). The separate manufacturing process can produce the first-die interconnects 804 and the die enclosures according to a protrusion measure 812 (e.g., a height of the metal structures, such as a length measured between the die bottom surface and a distal portion of the first-die interconnects 804 and the die enclosures). In some embodiments, the protrusion measure 812 can include a distance less than 20 μm. According to the protrusion measure 812, the distal portions (e.g., relative to the die bottom surface) of the first-die interconnects 804 and the die enclosures can be coplanar along a horizontal plane that is parallel with the die bottom surface. In some embodiments, the enclosures can include solder that can be bonded through thermal compression bonding or mass reflow.

In some embodiments, the separate manufacturing process can include forming one or more TSVs (e.g., inner TSVs and/or periphery TSVs) directly contacting the interconnects and/or the enclosures. In some embodiments, a dielectric filler 814 (e.g., dielectric epoxy or paste) can be applied between one or more of the inner enclosures and the outer enclosure, between inner enclosures, etc.

Figure 9:
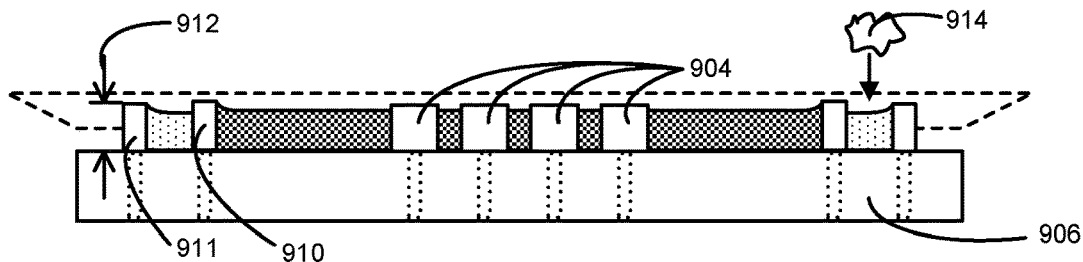

As illustrated in FIG. 9, the method can include a stage for providing a substrate 906 (e.g., a PCB or another die, such as the second die, one of the inner dies, etc.). The substrate 906 can include substrate interconnects 904 (e.g., solid metal structures for providing electrical connections to the substrate 906, such as for a portion of the internal interconnects) protruding above a substrate top surface. The substrate 906 can further include one or more substrate inner enclosures (e.g., a substrate inner enclosure 910) and a substrate outer enclosure 911. The substrate inner enclosures and the substrate outer enclosure 911 can each be a solid metal structure, such as for a portion of the metal enclosure structure. The substrate inner enclosures can each encircle a perimeter of the corresponding substrate interconnects (e.g., the substrate interconnects 904) along a horizontal plane, and the substrate outer enclosure 911 can encircle the substrate inner enclosures along a horizontal plane.

The substrate 906 with the substrate interconnects 904 and the substrate enclosures can be manufactured using a separate manufacturing process (e.g., wafer or die level manufacturing process or a process for manufacturing a printed circuit board). Similar to the stage illustrated in FIG. 8, the separate manufacturing process can produce the substrate interconnects 904 and the substrate enclosures according to a protrusion measure 912 (e.g., a height of the metal structures, such as a length measured between the second boundary surface and a distal portion of the substrate interconnects 904 and the substrate enclosures). In some embodiments, the protrusion measure 912 can include a distance less than 20 μm. According to the protrusion measure 912, the distal portions (e.g., relative to the substrate top surface) of the substrate interconnects 904 and the substrate enclosures can be coplanar along a horizontal plane that is parallel with the substrate top surface. In some embodiments, the enclosures can include solder that can be bonded through thermal compression bonding or mass reflow.

In some embodiments, the separate manufacturing process can include forming one or more TSVs (e.g., inner TSVs and/or periphery TSVs) directly contacting the interconnects and/or the enclosures. In some embodiments, a dielectric filler 914 (e.g., dielectric epoxy or paste) can be applied between one or more of the inner enclosures and the outer enclosure, between inner enclosures, etc.

Figure 10:
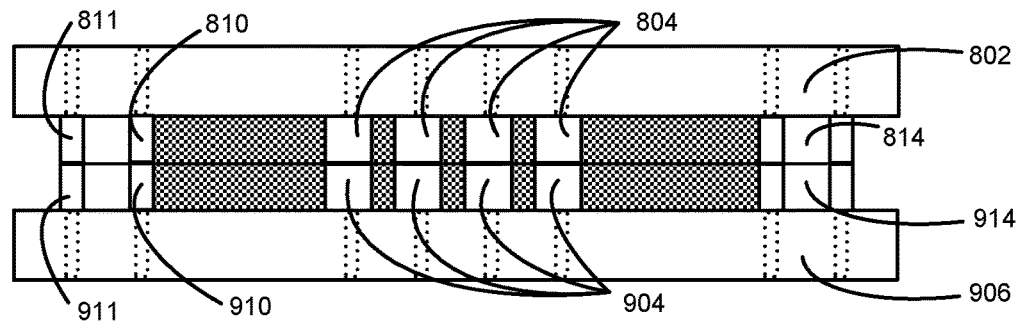

As illustrated in FIG. 10, the method can include a stage for aligning the substrate 906 and the die 802. The substrate 906 and the die 802 can be aligned based on aligning reference portions (e.g., a center portion, a periphery edge or surface, etc.) thereof along a line or a plane (e.g., a vertical line or plane for FIG. 10). The structures can be aligned such that the die enclosures (e.g., the first-die inner enclosure 810 and the first-die outer enclosure 811) and the substrate enclosures (e.g., the substrate inner enclosure 910 and the substrate outer enclosure 911) are aligned along a line or a plane (e.g., a vertical line or plane). Further, the structures can be aligned such that the die enclosures and the substrate enclosures directly contact each other. The first-die interconnects 804 and the substrate interconnects 904 can be similarly aligned.

In some embodiments, the dielectric material between the enclosures can be hardened or set before aligning the structures. In some embodiments, the dielectric material can be applied between the enclosures after aligning the structures.

Figure 11:
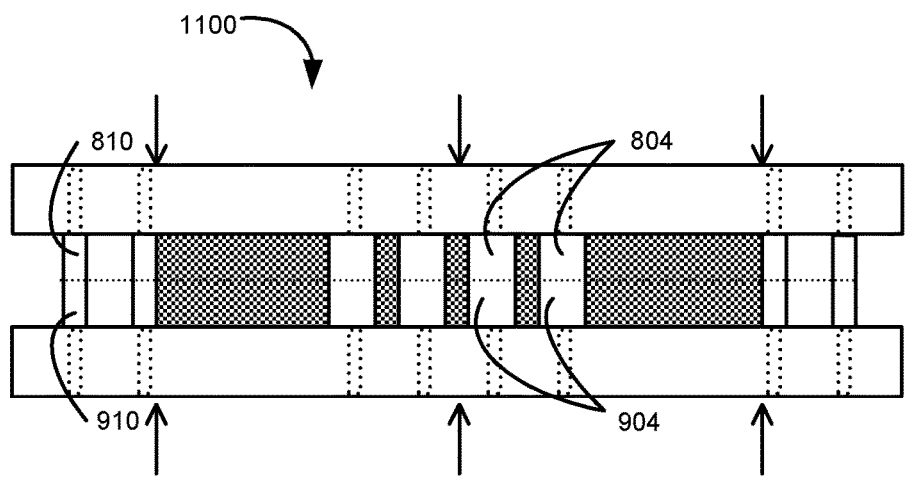

As illustrated in FIG. 11, the method can include a stage for bonding the metal structures (e.g., the die enclosures to the substrate enclosures and/or the first-die interconnects 804 to the substrate interconnects 904). For example, FIG. 11 can represent a diffusion bonding process 1100 (e.g., Cu—Cu diffusion bonding) that includes a solid-state welding process (e.g., utilizing coalescence at temperatures essentially below the melting point of the structures, with or without pressure/force pushing the structures together) for joining metals based on solid-state diffusion. The diffusion bonding process 1100 can include creating a vacuum condition or filling the space (e.g., the enclosed space) with inert gas, heating the metal structures, pressing the metal structures together, or a combination thereof.

Based on the bonding stage, the metal structures can bond or fuse and form a continuous structure. For example, the die enclosures and the substrate enclosures can be bonded to form the various inner and outer enclosures discussed above. Also for example, the first-die interconnects 804 and the substrate interconnects 904 can be bonded to form the internal interconnects discussed above.

Diffusion bonding the die enclosures to the substrate enclosures (e.g., Cu—Cu diffusion bonding) and the first-die interconnects 804 and the substrate interconnects 904 (e.g., Cu—Cu diffusion bonding) provides reduced manufacturing failures and cost. The diffusion bonding process can eliminate solder, thereby reducing any potential failures and costs associated with the soldering process. Further, the interconnects and the enclosures can be bonded using one bonding process, which can further simply the manufacturing process.

In some embodiments, the bonding stage can include hardening/curing of the dielectric material between the enclosures. For example, the conditions/environment for the bonding stage can include setting a temperature, applying a light or a chemical agent, waiting, etc. required to cure the dielectric material. In some embodiments, the dielectric material can be applied between the enclosures and cured after bonding the structures (e.g., through an application port/hole that is filled at a later stage).

Figure 12:
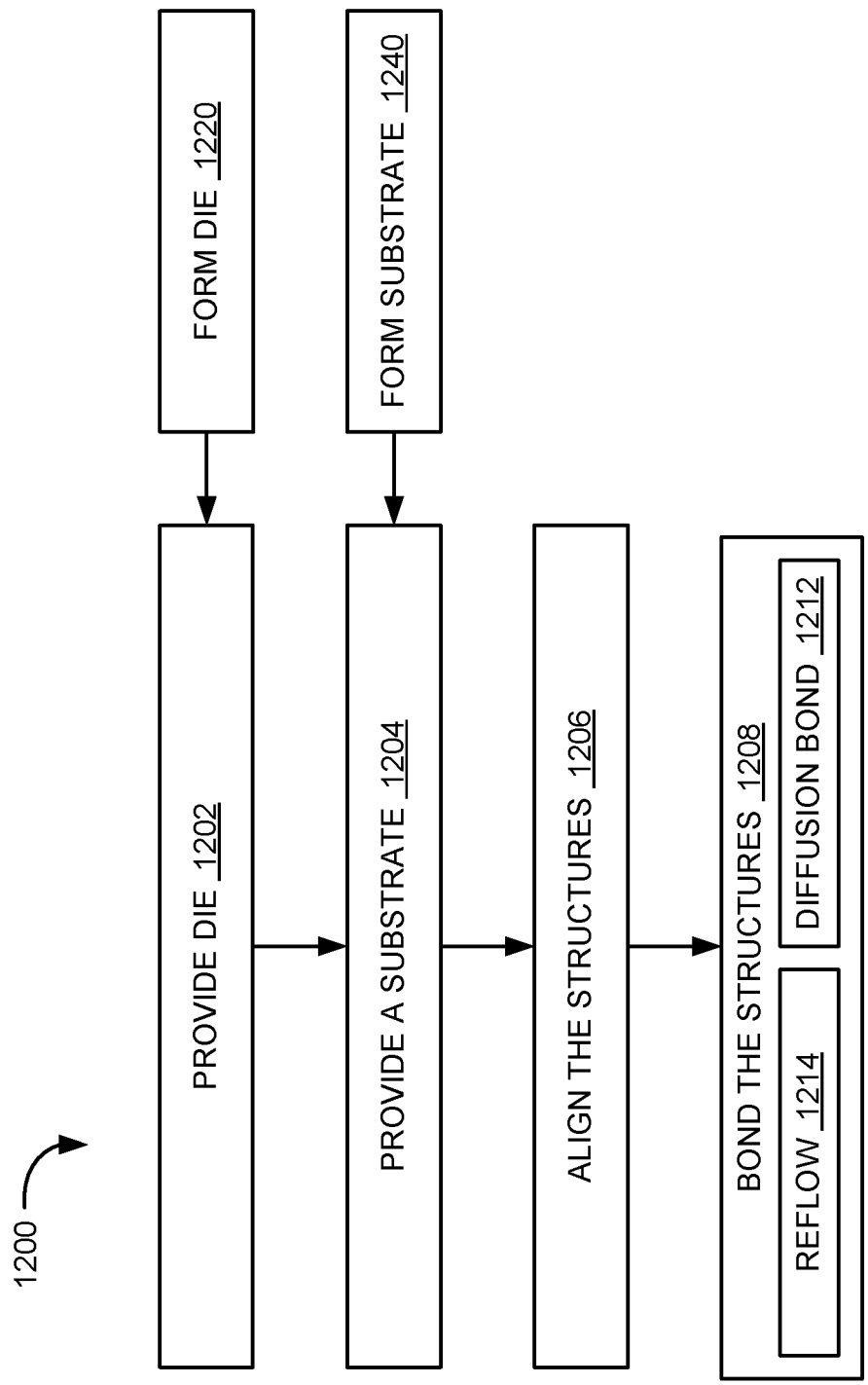
FIG. 12 is a flow diagram illustrating an example method of manufacturing a semiconductor device in accordance with an embodiment of the present technology.

FIG. 12 is a flow diagram illustrating an example method 1200 ("method 1200") of manufacturing a semiconductor device in accordance with an embodiment of the present technology. For example, the method 1200 can be implemented to manufacture the semiconductor device 200 of FIGS. 2 and 3, the semiconductor device 400 of FIGS. 4 and 5, and/or the semiconductor device 600 of FIGS. 6 and 7. Also for example, the method 1200 can include stages illustrated in FIGS. 8-11.

The method 1200 can include providing one or more semiconductor dies (e.g., the die or the dies illustrated in FIGS. 2-7) as illustrated at block 1202. Providing the semiconductor die can correspond to the stage illustrated in FIG. 8. The provided die can include die interconnects (e.g., the first-die interconnects 804 of FIG. 8) and die enclosures (e.g., the inner enclosure 810 of FIG. 8 or the outer enclosure 811 of FIG. 8) protruding downward from the die bottom surface. The die enclosures can peripherally surround the die interconnects on or along the die bottom surface. The provided die can further have bottom or distal portions or surfaces of the die interconnects coplanar with bottom or distal portions or surfaces of the die enclosure. For example, the bottom or distal portions of the die interconnects and the die enclosure can be coplanar along a horizontal plane that is parallel to the die bottom surface and is vertically offset from the die bottom surface by the protrusion measure 812 of FIG. 8.

In some embodiments the die enclosures can include copper, aluminum, nickel, other metals, or a combination thereof. In some embodiments the die enclosures can include solder directly contacting the die bottom surface or directly attached to a distal surface or portion of a metal wall structure. In some embodiments, each of the die enclosures can be electrically connected to a signal or a voltage level (e.g., such as a voltage source or ground).

The die can be manufactured or formed using a separate manufacturing process, as illustrated at block 1220. For example, the die manufacturing process can include wafer-level processing, such as a doping process to form integrated circuitry and a singulating process to separate the individual dies. Also for example, the die manufacturing process can include formation of TSVs.

The method 1200 can further include providing a substrate (e.g., the substrate 906 of FIG. 9) as illustrated at block 1204. Providing the substrate can correspond to the stage illustrated in FIG. 9. The provided substrate can include substrate interconnects (e.g., the substrate interconnects 904 of FIG. 9) and substrate enclosures (e.g., the inner enclosure 910 of FIG. 9 and the outer enclosure 911 of FIG. 9) protruding upward from the substrate top surface. The substrate enclosures can peripherally surround the substrate interconnects on or along the substrate top surface. The provided substrate can further have top or distal portions or surfaces of the substrate interconnects coplanar with top or distal portions or surfaces of the substrate enclosures. For example, the top or distal portions of the substrate interconnects and the substrate enclosures can be coplanar along a horizontal plane that is parallel to the substrate top surface and is vertically offset from the substrate top surface by the protrusion measure 912 of FIG. 9.

In some embodiments the substrate enclosures can include copper, aluminum, nickel, other metals, or a combination thereof. In some embodiments the substrate enclosures can include solder directly contacting the substrate top surface or directly attached to a distal surface or portion of a metal wall structure. In some embodiments, each of the substrate enclosures can be electrically connected to a signal or a voltage level (e.g., such as a voltage source or ground).

The substrate can be manufactured or formed using a separate manufacturing process, as illustrated at block 1240. For example, the substrate manufacturing process (e.g., for manufacturing another die) can include wafer-level processing similar to processes illustrated by block 1220. Also for example, the substrate manufacturing process (e.g., for manufacturing PCB substrate) can include solder mask shaping, trace formation, planarization, etc. Also for example, the substrate manufacturing process can include formation of TSVs.

The method 1200 can further include aligning the structures (e.g., the die and the substrate) as illustrated at block 1206. Aligning the structures can correspond to the stage illustrated in FIG. 10. For example, the alignment process can align the die over the substrate with a portion of each die interconnect coincident with a corresponding portion of each substrate interconnect along vertical lines and/or a portion of the die enclosures coincident with the substrate enclosures along vertical lines. Also for example, the alignment process can align the die over the substrate with the die enclosures directly contacting the substrate enclosures.

The method 1200 can further include bonding the structures (e.g., the die interconnects to the substrate interconnects and/or the die enclosures to the substrate enclosures) as illustrated at block 1208. The bonding process can correspond to the stage illustrated in FIG. 11. The bonding process can include controlling temperature of one or more of the structures (e.g., heating to bond and then cooling to solidify the jointed structures), applying pressure on the structures, or a combination thereof. For example, the bonding process can include diffusion bonding (e.g., thermal compression bonding or TCB) as illustrated at block 1212 and/or reflowing solder (e.g., mass reflow in the case solder is applied) as illustrated at block 1214.

Through the bonding process, the enclosures, the enclosed spaces, interconnects, etc. can be formed. Since metal (e.g., copper, solder, etc.) sufficiently blocks moisture and other debris, underfill is no longer needed for the manufacturing process. As such, the bonding process can bond the structures without any underfill in the enclosed spaces or in the space between the substrate top surface and the die bottom surface. Further, the above described bonding process can eliminate oxide to oxide bonding (e.g., for hybrid bonding) and/or the requirement on wafer surface conditions (e.g., surface roughness control), which can lead to lower manufacturing cost and error.

Figure 13:
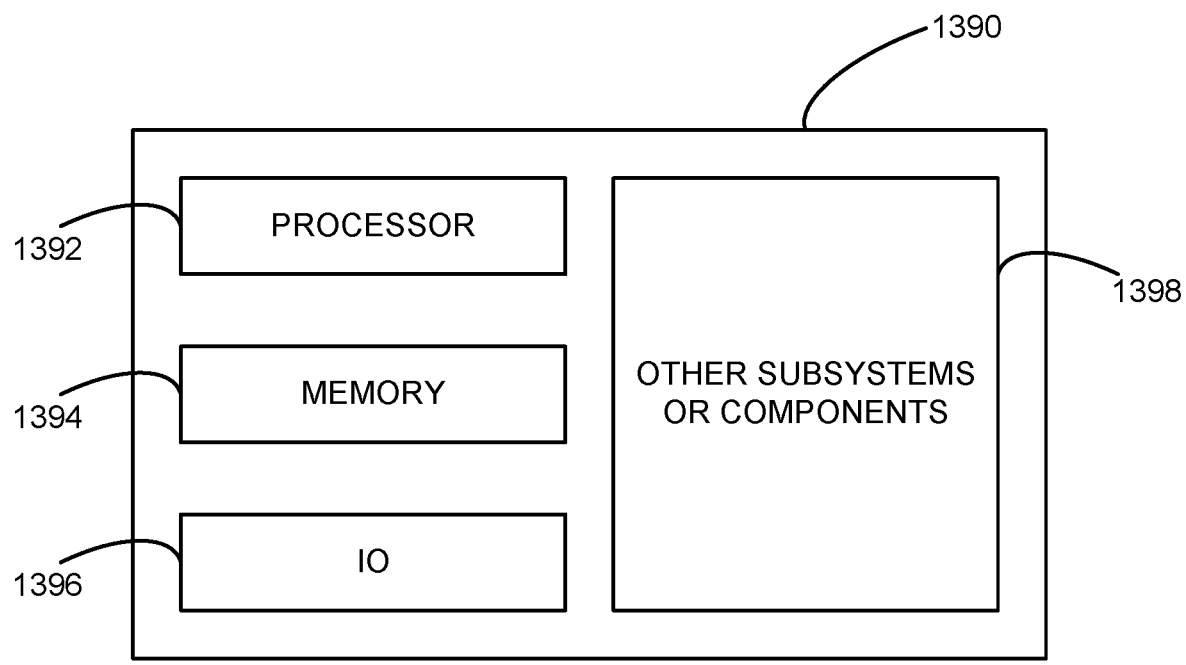
FIG. 13 is a block diagram illustrating a system that incorporates a semiconductor device in accordance with embodiments of the present technology.

FIG. 13 is a block diagram illustrating a system that incorporates a semiconductor device in accordance with embodiments of the present technology. Any one of the semiconductor devices having the features described above with reference to FIGS. 2-12 can be incorporated into any of a myriad of larger and/or more complex systems, a representative example of which is system 1390 shown schematically in FIG. 13. The system 1390 can include a processor 1392, a memory 1394 (e.g., SRAM, DRAM, flash, and/or other memory devices), input/output devices 1396, and/or other subsystems or components 1398. The semiconductor assemblies, devices, and device packages described above with reference to FIGS. 2-12 can be included in any of the elements shown in FIG. 13. The resulting system 1390 can be configured to perform any of a wide variety of suitable computing, processing, storage, sensing, imaging, and/or other functions. Accordingly, representative examples of the system 1390 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 1390 include lights, cameras, vehicles, etc. With regard to these and other examples, the system 1390 can be housed in a single unit or distributed over multiple interconnected units, e.g., through a communication network. The components of the system 1390 can accordingly include local and/or remote memory storage devices and any of a wide variety of suitable computer-readable media.

From the foregoing, it will be appreciated that specific embodiments of the present technology have been described herein for purposes of illustration, but that various modifications may be made without deviating from the disclosure. In addition, certain aspects of the disclosure described in the context of particular embodiments may be combined or eliminated in other embodiments. Further, while advantages associated with certain embodiments have been described in the context of those embodiments, other embodiments may also exhibit such advantages. Not all embodiments need necessarily exhibit such advantages to fall within the scope of the present disclosure. Accordingly, the disclosure and associated technology can encompass other embodiments not expressly shown or described herein.

We claim:

1. A semiconductor device, comprising:
a first die;
a second die attached over the first die;
a third die attached over the second die;
a first metal enclosure directly contacting and vertically extending between the first die and the second die, wherein the first metal enclosure peripherally encircles a set of one or more internal interconnects along a horizontal plane;
a second metal enclosure directly contacting and vertically extending between the first die and the second die, wherein the second metal enclosure peripherally encircles the first metal enclosure along the horizontal plane without directly contacting the first metal enclosure;
a first enclosure connector directly contacting the first metal enclosure, wherein the first enclosure connector is for electrically connecting the first metal enclosure to a first voltage level;
a second enclosure connector directly contacting the second metal enclosure, wherein the second enclosure connector is for electrically connecting the second metal enclosure to a second voltage level;
an upper-level inner enclosure directly contacting and vertically extending between the second die and the third die; and
an upper-level outer enclosure directly contacting and vertically extending between the second die and the third die, wherein the upper-level outer enclosure peripherally encircles the upper-level inner enclosure;
wherein:
the first metal enclosure, the second metal enclosure, the first enclosure connector, and the second enclosure connector are configured to provide an enclosure capacitance
the first metal enclosure is a lower-level inner enclosure;
the second metal enclosure is a lower-level outer enclosure;
the first enclosure connector includes one or more first through silicon vias (TSVs) extending through the second die and directly contacting the lower-level inner enclosure and the upper-level inner enclosure; and
the second enclosure connector includes one or more second TSVs extending through the second die and directly contacting the lower-level outer enclosure and the upper-level outer enclosure.

2. The semiconductor device of claim 1, wherein the first metal enclosure and the second metal enclosure are separated by an enclosure separation distance, wherein the enclosure separation distance correlates to the enclosure capacitance.

3. The semiconductor device of claim 2, wherein the first metal enclosure and the second metal enclosure form an enclosure separation space between the first die and the second die, wherein the enclosure separation space is vacuum or filled with a gas.

4. The semiconductor device of claim 2, wherein the first metal enclosure and the second metal enclosure form an enclosure separation space between the first die and the second die, wherein the enclosure separation space is filled with a dielectric material.

5. The semiconductor device of claim 4, wherein the dielectric material correlates to the enclosure capacitance for further increasing the enclosure capacitance.

6. The semiconductor device of claim 2, wherein the first metal enclosure and the second metal enclosure are concentrically arranged along a horizontal plane, wherein the enclosure separation distance is uniform between the first metal enclosure and the second metal enclosure.

7. The semiconductor device of claim 1, wherein:
the second metal enclosure is an outer enclosure that encircles an overall enclosed space;
the first metal enclosure is a first inner enclosure that encircles a first inner space within the overall enclosed space; and
further comprising:
a second inner enclosure directly contacting and vertically extending between the first die and the second die, wherein the second inner enclosure peripherally encircles a further set of interconnects and a second inner space that is within the overall enclosed space and mutually exclusive from the first inner space.

8. The semiconductor device of claim 1, wherein:
one or more points, surfaces, or portions on each of the upper-level inner enclosure and the lower-level inner enclosure are coincident along a first vertical line; and
one or more points, surfaces, or portions on each of the upper-level outer enclosure and the lower-level outer enclosure are coincident along a second vertical line.

9. The semiconductor device of claim 1, wherein:
the second metal enclosure is an outer-most enclosure along a horizontal direction; and
the second metal enclosure is electrically coupled to electrical ground.

10. A semiconductor device including a die stack having at least two dies, comprising:
a plurality of interconnects electrically coupling two or more adjacent dies of the die stack;
a first metal sealing member and a second metal sealing member disposed between a pair of adjacent dies, wherein the first metal sealing member encloses one or more interconnects along a horizontal plane and is nested within the second metal sealing member;
a first connection mechanism directly contacting the first metal sealing member for electrically coupling the first metal sealing member to a first voltage level; and
a second connection mechanism directly contacting the second metal sealing member for electrically coupling the second metal sealing member to a second voltage level for providing an enclosure capacitance surrounding the one or more interconnects, a center portion of at least one of the pair of adjacent dies, or a combination thereof.

11. The semiconductor device of claim 10, wherein the first metal sealing member and the second metal sealing member are separated by an enclosure separation distance, wherein the enclosure separation distance correlates to the enclosure capacitance.

12. The semiconductor device of claim 11, wherein the first metal sealing member and the second metal sealing member form an enclosure separation space between the first die and the second die, wherein the enclosure separation space is vacuum or filled with a gas.

13. The semiconductor device of claim 11, wherein the first metal sealing member and the second metal sealing member form an enclosure separation space between the first die and the second die, wherein the enclosure separation space is filled with a dielectric material.

14. The semiconductor device of claim 13, wherein the dielectric material correlates to the enclosure capacitance for further increasing the enclosure capacitance.

15. The semiconductor device of claim 11, wherein the first metal sealing member and the second metal sealing member are concentrically arranged along the horizontal plane, wherein the enclosure separation distance is uniform between the first metal sealing member and the second metal sealing member.

16. The semiconductor device of claim 10, wherein:
the second metal sealing member is an outer enclosure that encircles an overall enclosed space;
the first metal sealing member is a first inner enclosure that encircles a first inner space within the overall enclosed space; and
further comprising:
a second inner metal sealing member directly contacting and vertically extending between the first die and the second die, wherein the second inner metal sealing member peripherally encircles a further set of interconnects and a second inner space that is within the overall enclosed space and mutually exclusive from the first inner space.

17. The semiconductor device of claim 10, further comprising:
a third die attached over the second die;
an upper-level inner enclosure directly contacting and vertically extending between the second die and the third die; and
an upper-level outer enclosure directly contacting and vertically extending between the second die and the third die, wherein the upper-level outer enclosure peripherally encircles the upper-level inner enclosure;
wherein:
the first metal sealing member is a lower-level inner enclosure;
the second metal sealing member is a lower-level outer enclosure;
the first enclosure connector includes one or more first through silicon vias (TSVs) extending through the second die and directly contacting the lower-level inner enclosure and the upper-level inner enclosure; and
the second enclosure connector includes one or more second TSVs extending through the second die and directly contacting the lower-level outer enclosure and the upper-level outer enclosure.

* * * * *